United States Patent [19]

Inoue et al.

[11] Patent Number: 5,781,256
[45] Date of Patent: Jul. 14, 1998

[54] NONLINEAR RESISTANCE ELEMENT AND FABRICATION METHOD THEREOF IN WHICH TUNGSTEN ATOMS ARE DISTRIBUTED CONTINUOUSLY WITHIN THE INSULATING FILM

[75] Inventors: Takashi Inoue; Nagamasa Ono. both of Suwa, Japan

[73] Assignee: Seiko Epson Corporation. Tokyo, Japan

[21] Appl. No.: 716,175

[22] PCT Filed: Jan. 23, 1996

[86] PCT No.: PCT/JP96/00113

§ 371 Date: Sep. 23, 1996

§ 102(e) Date: Sep. 23, 1996

[87] PCT Pub. No.: WO96/23246

PCT Pub. Date: Aug. 1, 1996

[30] Foreign Application Priority Data

Jan. 23, 1995 [JP] Japan ........................ 7/8149

[51] Int. Cl.$^6$ ........................................ G02F 1/136
[52] U.S. Cl. ................................ 349/51; 349/52
[58] Field of Search ........................... 349/51, 52

[56] References Cited

U.S. PATENT DOCUMENTS 5,128,784  7/1992  Suzuki et al. ................ 349/51

FOREIGN PATENT DOCUMENTS

| | | |
|---|---|---|
| 1-300226 | 12/1989 | Japan . |
| 6-75251 | 3/1994 | Japan . |
| 6-250229 | 9/1994 | Japan . |
| 6-301062 | 10/1994 | Japan . |
| WO94/18600 | 8/1994 | WIPO . |

*Primary Examiner*—Huy Mai
*Assistant Examiner*—Walter Malinowski
*Attorney, Agent, or Firm*—Oliff & Berridge

[57] ABSTRACT

The method of fabricating a nonlinear resistance element includes the steps of: forming on a substrate a first conductive film having tantalum as a main component to which is added tungsten; forming an insulating film on the first conductive film by anodization of the first conductive film, using an electrolyte comprising tungstic acid ions and under conditions by which the pH of the electrolyte is conditioned in accordance with the tungsten concentration within the first conductive film; and forming a second conductive film on the insulating film. The "polarity difference" of the nonlinear resistance element varies with the tungsten concentration in the first conductive film, and it also varies with the pH of the electrolyte, even when the tungsten concentration is the same. Therefore, the "polarity difference" can be set to substantially zero by regulating the tungsten concentration within the first metal film and by setting the pH of the electrolyte that is used in the anodization to match this tungsten concentration. An aqueous solution of ammonium tungstate is preferably used as the electrolyte for the anodization and ammonia is preferably used as the pH conditioner.

26 Claims, 17 Drawing Sheets

NONLINEAR RESISTANCE ELEMENT AND FABRICATION METHOD THEREOF IN WHICH TUNGSTEN ATOMS ARE DISTRIBUTED CONTINUOUSLY WITHIN THE INSULATING FILM

TECHNICAL FIELD

This invention relates to a nonlinear resistance element and a fabrication method thereof, together with a liquid crystal display device, and, in particular, it relates to an element having a metal-insulator-metal (MIM) structure (hereinafter called a MIM element) that is used as a switching element in an active matrix liquid crystal display device, and a fabrication method thereof.

BACKGROUND OF ART

A MIM element is a switching element that is configured of a thin insulator film sandwiched between two thin conductive films, making use of the fact that the voltage-current characteristic between the thin conductive films is nonlinear.

In order to provide a high level of image quality, a liquid crystal panel using a MIM element must satisfy the following conditions:

(1) The capacity of the element must be sufficiently smaller than that of the liquid crystal.
(2) Time-dependent variations in the characteristics of the element must be small.
(3) The voltage-current characteristic of the element must have a large nonlinearity, and the ratio of the on-current to the off-current must be sufficiently large.
(4) When an element is driven in such a manner that the polarity of the drive voltage periodically changes, the voltage-current characteristic must be symmetrical on the positive voltage side and the negative voltage side.

Note that the drive method in which the polarity of the drive voltage periodically changes is hereinafter called an "inverting drive."

One of the present inventors and two other persons have developed a technique of first forming on a glass substrate a first metal film having tantalum (Ta) as a main component to which is added tungsten (W), then forming an insulating film by anodization of the first metal film, to satisfy the above described conditions demanded of a MIM element, and have applied for patents thereon (International Application No. PCT/JP94/00204 and International Laid-Open No. WO 94/18600).

Use of this technique can greatly reduce time-dependent variations in the characteristics of the MIM element.

The present inventors continued their research into even further satisfying the conditions of the MIM element. This research concentrated on further reducing time-dependent variations in the characteristics of the MIM element, and also on establishing a technique of reducing the "polarity difference" by making the voltage-current characteristic on the positive voltage side and negative voltage side symmetrical when the MIM element is used in an inverting drive.

This "polarity difference" is the potential difference $\Delta V$ (=V1−V2) between the voltage V1, necessary for a current (Poole-Frenkel current) of 1 A/cm$^2$ to flow from the first conductive film through the insulating film and into the second conductive film, and the voltage V2, necessary for a current of 1 A/cm$^2$ to flow from the second conductive film through the insulating film and into the first conductive film, when the MIM is subjected to an inverting drive as shown in FIG. 16. Note that the absolute value of current concentration (logarithmic scale) is plotted along the vertical axis in FIG. 16 and the absolute value of voltage (linear scale) is plotted along the horizontal axis. Reference number 1100 and reference number 1200 in FIG. 16, respectively, denote the characteristics on the positive voltage side and the negative voltage side of the MIM element.

When the display is switched to a new screen after the same pattern has been displayed for a long time on the liquid crystal screen, the previous display pattern will remain clearly visible if the "polarity difference" is large, generating a phenomenon called "sticking" and thus causing the display quality of the liquid crystal display device to deteriorate. The generation of this "sticking phenomenon" is caused by polarization of the liquid crystal elements by the DC component generated by the non-symmetry of the MIM element during inverting drive. Therefore, it is important to reduce the polarity difference of the MIM element to improve the display quality of the liquid crystal display device.

This invention was made on the basis of results obtained by the above described research performed by the inventors.

DISCLOSURE OF INVENTION

An objective of this invention is to provide a novel MIM element that enables a further reduction in time-dependent variations in the characteristics of the MIM element, and a fabrication method thereof.

Another objective of this invention is to reduce the "polarity difference" of the MIM element and thus prevent the "sticking phenomenon" that occurs in liquid crystal display devices.

In addition to reducing the above described "polarity difference," a further objective of this invention is to increase the ratio of the on-current to the off-current in the MIM element even further than in the prior art and thus provide a liquid crystal display device that is highly reliable and can provide a high-quality display.

The MIM element of this invention is configured of a first conductive film, an insulating film, and a second conductive film deposited in sequence on a substrate, wherein tungsten atoms are distributed continuously in the film thickness direction of the insulating film.

Research performed by the present inventors has determined that a MIM element in which tungsten atoms are distributed continuously in the film thickness direction of the insulating film has lower time-dependent variations in the characteristics thereof than a MIM element with a non-continuous distribution.

The method of fabricating a nonlinear resistance element in accordance with this invention comprises the steps of: forming on a substrate a first conductive film having tantalum as a main component to which is added tungsten; forming an insulating film on the first conductive film by anodization of the first conductive film, using an electrolyte comprising tungstic acid ions and under conditions by which the pH of the electrolyte is conditioned in accordance with the tungsten concentration within the first conductive film; and forming a second conductive film on the insulating film.

The inventors' research has also determined that it is not sufficient simply to supply tungsten atoms from the first conductive film in order to make the distribution of tungsten atoms continuous. Rather it is necessary to perform anodization using an electrolyte comprising tungstic acid ions, whereby tungsten atoms are supplied into the insulating film from the electrolyte.

This research has further determined that the "polarity difference" of the MIM element varies with the tungsten concentration in the first conductive film, and it also varies with the pH of the electrolyte, even when the tungsten concentration is the same. Therefore, the "polarity difference" can be set to be substantially zero by regulating the tungsten concentration within the first conductive film and setting the pH of the electrolyte that is used in the anodization to match this tungsten concentration. The tungsten concentration within the first conductive film is preferably set to ensure a large ratio of on-current to off-current in the nonlinear resistance element.

An aqueous solution of a tungstate, such as potassium tungstate, sodium tungstate, lithium tungstate, or ammonium tungstate, can be used as the electrolyte for the anodization, but it is preferable to use an aqueous solution of ammonium tungstate and also use ammonia as the pH conditioner. In this case, the dependency of the "polarity difference" of the nonlinear resistance element on pH is dramatic, so that it is simple to control the pH to ensure that the "polarity difference" is zero.

It is also preferable that the electrolyte is maintained at 0° C. to 10° C. for the anodization of the first conductive film. This is effective for increasing the ratio of the on-current to the off-current of the MIM element.

It is further preferable that annealing is performed after the anodization of the first conductive film. The research of the present inventors has shown that the effect on the "polarity difference" of the MIM element differs with annealing temperature, even when the tungsten concentration of the first conductive film is the same. In other words, this research has determined that MIM elements of different annealing temperatures will need the same pH value for making the "polarity difference" zero, but when the pH is not at the necessary value, these MIM elements will show different variations of the "polarity difference." From consideration of control over the pH, it is preferable to select an optimal annealing temperature.

If a film of a metal such as chrome is used as the second conductive film, it is preferable that the proportion of tungsten added to the first conductive film is between 0.1 wt. % and 2 wt. %. This enables a continuous distribution of the tungsten atoms within the insulating film and also makes it possible to maintain the electrical conductivity thereof at a suitable value. If the quantity of tungsten that is added is too small in this case, it will not be possible to keep the variations with time in the characteristics of the element sufficiently small; if too much tungsten is added, it will no longer be possible to keep the steepness in the current-voltage characteristics of the element sufficiently high.

If a transparent conductive film of a material such as indium tin oxide (ITO) is used as the second conductive film, it is preferable that the proportion of tungsten added to the first conductive film is between 1.0 wt. % and 10.0 wt. %. This enables a continuous distribution of the tungsten atoms within the insulating film when an ITO film is used as the second conductive film and also makes it possible to maintain the electrical conductivity thereof at a suitable value.

That is to say, when an ITO film is used, oxygen atoms from that ITO film will migrate into the insulating film, increasing the resistance of the insulating film and thus lowering the on-current. It is therefore necessary to increase the supply of tungsten atoms from the first conductive film in order to alleviate this increase in resistance and maintain the electrical conductivity of the insulating film at a suitable value for a MIM element. Thus the tungsten concentration of the first conductive film is increased in comparison with a configuration in which a film of a metal such as chrome is used as the second conductive film, thereby ensuring sufficiently few time-dependent variations of the characteristics of the element and sufficient steepness in the current-voltage characteristics of the element. In this case, the proportion of tungsten added to the first conductive film is preferably between 1.0 wt. % and 10.0 wt. %, even when a conductive film of an oxide other than ITO is used as the second conductive film.

The liquid crystal display device of this invention is an active matrix liquid crystal display device that uses a nonlinear resistance element fabricated by the method of this invention as a switching element. This enables the implementation of a high-performance liquid crystal display device that has few time-dependent variations in the characteristics of the liquid crystal, in which the sticking phenomenon is reduced, and which enables a high-contrast display.

DESCRIPTION OF PREFERRED EMBODIMENTS

The MIM element of this invention is configured of a first conductive film, an insulating film, and a second conductive film deposited in sequence on a substrate, wherein tungsten atoms are distributed continuously in the film thickness direction of the insulating film. It is preferable that the tungsten atoms are distributed substantially uniformly in the film thickness direction of the insulating film.

It is preferable that the first conductive film is a metal film where the main component is tantalum to which is added tungsten, the insulating film is an anodized film obtained by anodization of this first conductive film, and the second conductive film is a metal film or a transparent conductive film of a material such as indium tin oxide (ITO) wherein tantalum atoms and tungsten atoms are distributed continuously within the second conductive film in the film thickness direction of the insulating film.

If a metal film is used as the second conductive film, it is preferable that the proportion of tungsten added to the first conductive film is between 0.1 wt. % and 2.0 wt. %.

If an ITO film is used as the second conductive film, it is preferable that the proportion of tungsten added to the first conductive film is between 1.0 wt. % and 10.0 wt. %.

Figure 4A:
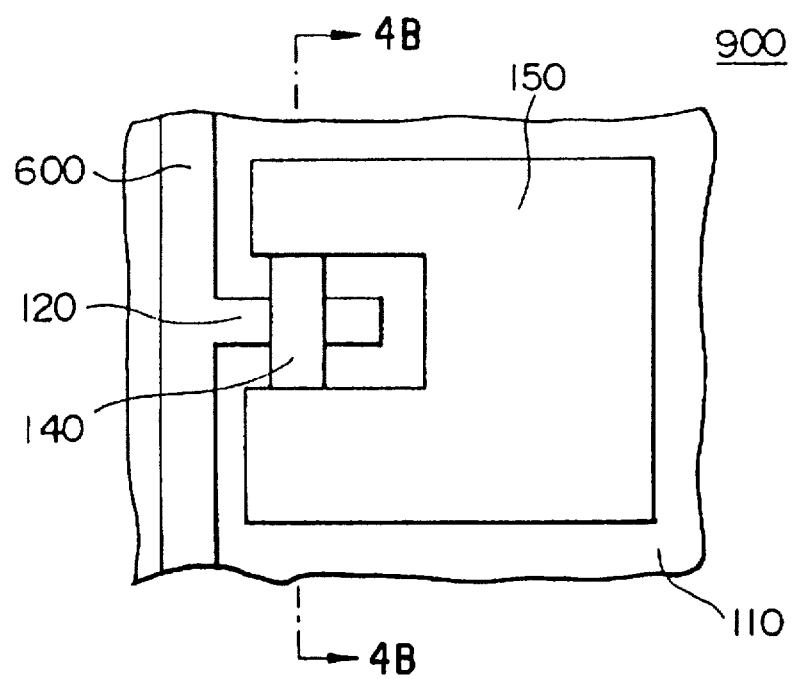
FIG. 4A is a plan view of a MIM element in which a metal film is used as the second conductive film and FIG. 4B is a cross-sectional view of the MIM element taken along the line A—A in FIG. 4A.
Figure 4B:
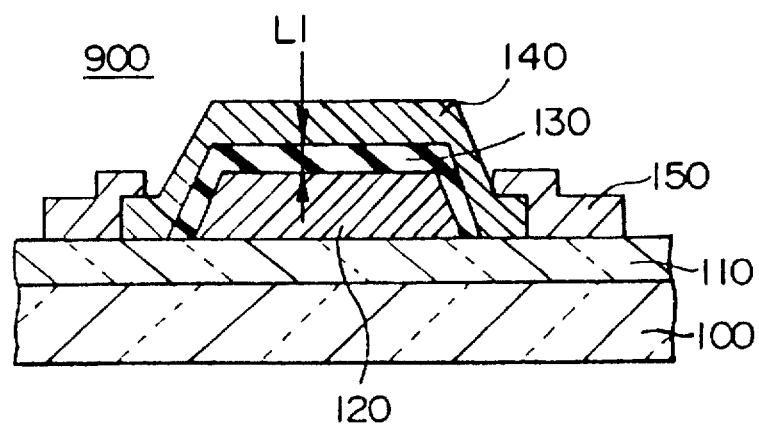

More specifically, if a film of metal is used as the second conductive film, a MIM element 900 of this invention has the configuration shown in FIGS. 4A and 4B. FIG. 4A is a plan view of this MIM element and FIG. 4B is a cross-sectional view thereof taken along the line A—A in FIG. 4A.

A film 110 of tantalum oxide ($Ta_2O_5$) is formed on a transparent substrate 100 of a material such as glass, then an alloy film 120 of tantalum and tungsten is formed thereon as the first conductive film. An insulating film 130 is then formed thereon by anodization, followed by a film 140 of chrome as the second conductive film. An ITO film 150 is then formed in electrical contact with one side of the chrome film 140 as a pixel electrode.

Figure 5A:
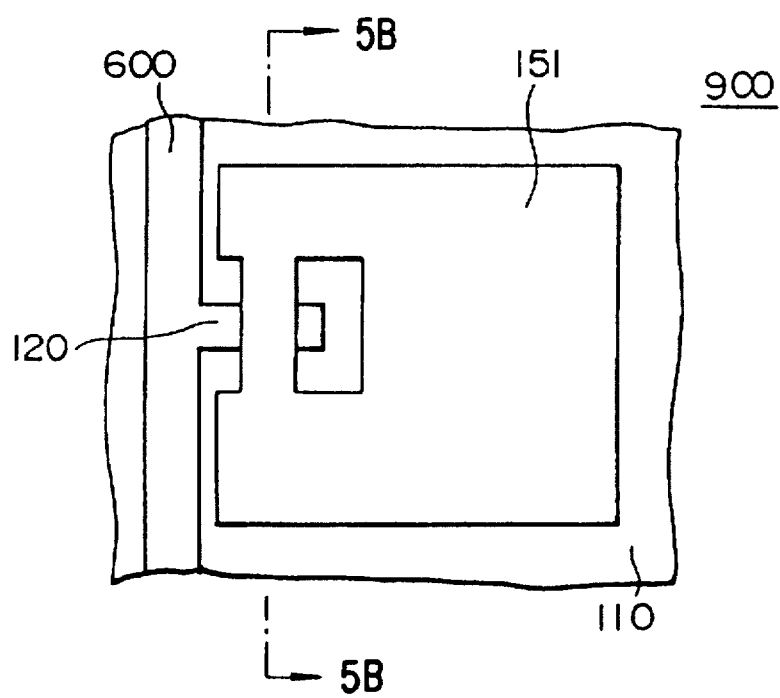
FIG. 5A is a plan view of a MIM element in which an ITO film is used as the second conductive film and FIG. 5B is a cross-sectional view of the MIM element taken along the line C—C in FIG. 5A.
Figure 5B:
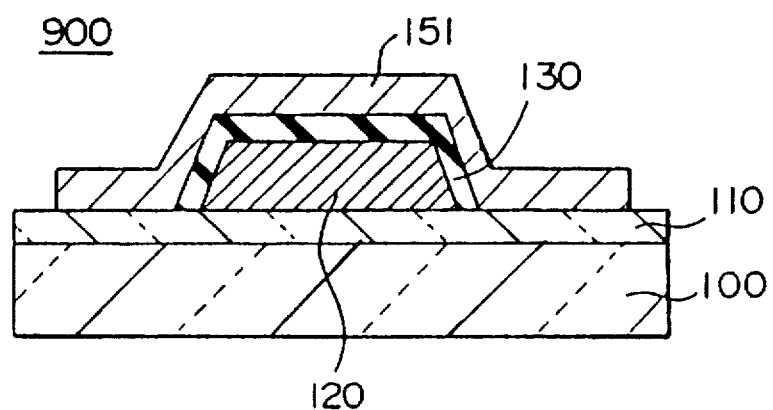

If an ITO film is used as the second conductive film, a MIM element of this invention has the configuration shown in FIGS. 5A and 5B. FIG. 5A is a plan view of this MIM element and FIG. 5B is a cross-sectional view thereof taken along the line C—C in FIG. 5A.

This configuration is substantially the same as that shown in FIGS. 4A and 4B except that an ITO film 151 is formed as the second conductive film and this ITO film 151 also functions as the pixel electrode.

Note that a metal film such as a chrome film could be used instead of the ITO film 151 in the configuration of FIGS. 5A and 5B. This MIM element can be applied to a reflective type of liquid crystal device.

The method of fabricating the MIM element in accordance with this invention comprises the steps of: forming on a substrate a first conductive film having tantalum as a main component to which is added tungsten; forming an insulating film on the first conductive film by anodization of the first conductive film, using an electrolyte comprising tungstic acid ions and under conditions by which the pH of the electrolyte is conditioned in accordance with the tungsten concentration within the first conductive film; and forming a second conductive film on the insulating film. In particular, it is preferable that an aqueous solution of ammonium tungstate is used as the electrolyte for the anodization, and ammonia is used as the pH conditioner to condition the pH of the electrolyte.

It is also preferable that the temperature of the electrolyte is held at between 0° C. and 10° C.

When a MIM element is driven in such a manner that the polarity of the drive voltage is periodically inverted, it is preferable that investigations are performed beforehand into the relationship between the tungsten concentration within the first conductive film and the pH of the electrolyte that enables a minimum in the amount of discrepancy in the voltage-current characteristics between the positive voltage side and the negative voltage side, the optimal value of pH of the electrolyte is determined in correspondence with the tungsten concentration within the first conductive film by using that relationship, and the pH of the electrolyte is conditioned to that optimal pH for the anodization of the first conductive film.

It is further preferable that, if the tungsten concentration within the first conductive film is increased, the anodization of the first conductive film is performed by reducing the pH of the electrolyte accordingly.

It is still further preferable that annealing is performed after the anodization of the first conductive film, and the annealing temperature is within the range of 350° C. to 450° C.

It is even further preferable that a first conductive film is formed, having tantalum as a main component to which is added 0.2 wt. % of tungsten, that first conductive film is anodized by using a saturated aqueous solution of ammonium tungstate, or an aqueous solution at 1/10 of the concentration of such a saturated aqueous solution, as the electrolyte and ammonia as a pH conditioner to condition the pH of the electrolyte to 9.0, thermal processing at 430° C. is then performed, and an insulating film is formed on the first conductive film.

Figure 15:
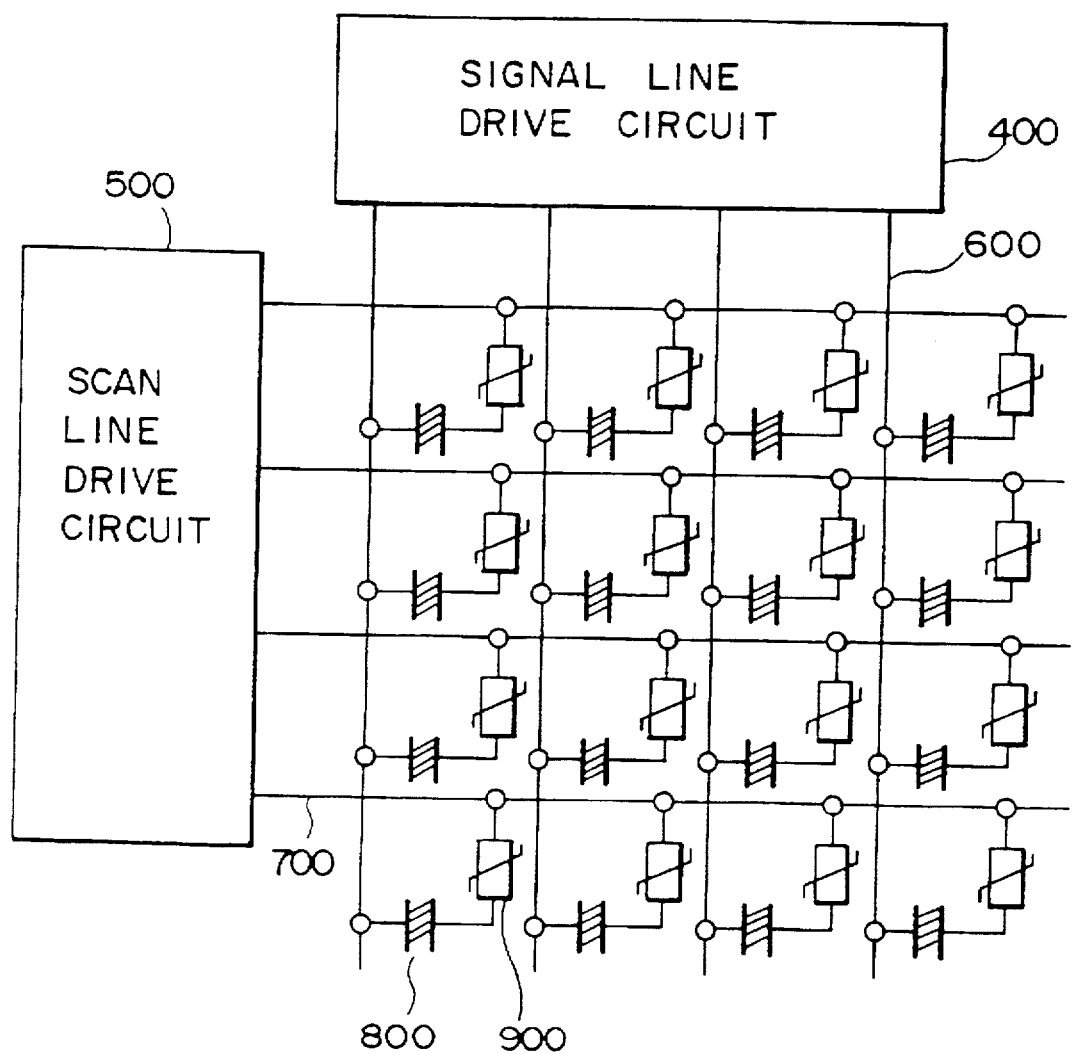
FIG. 15 shows the circuit configuration of an active matrix liquid crystal display device in which a MIM element is used as a switching element.
Figure 16:
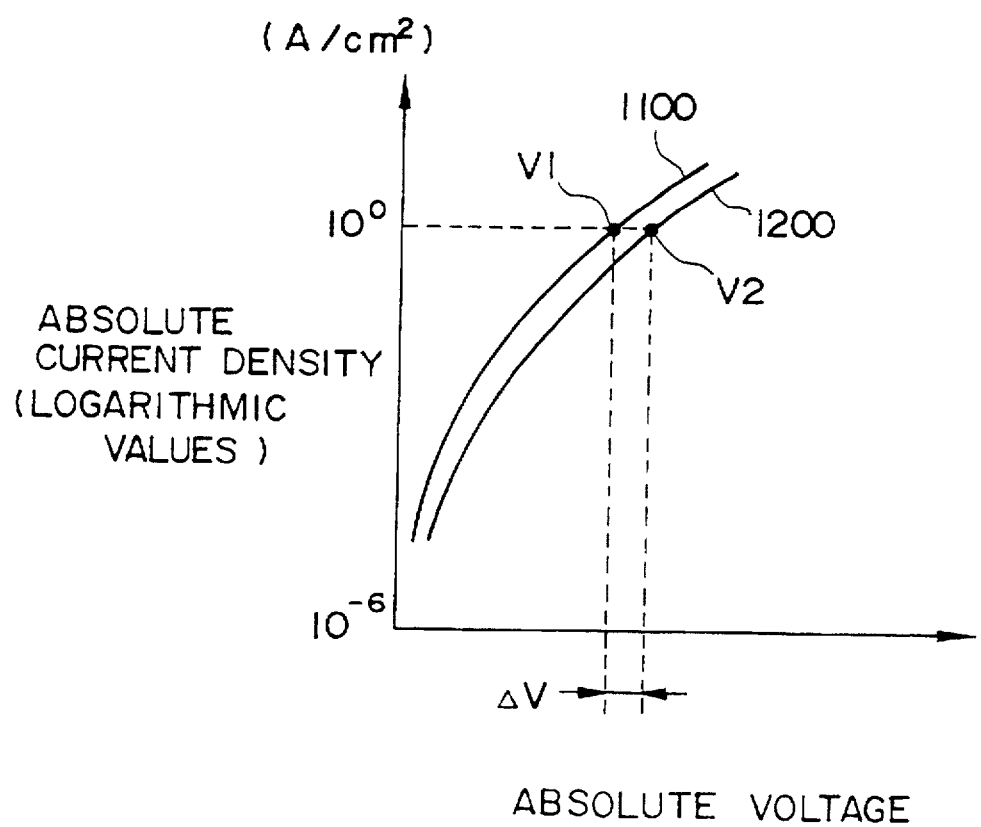
FIG. 16 is a graph illustrative of the "polarity difference" of the MIM element.

The circuit configuration of an active matrix liquid crystal display device of this invention, wherein a MIM is used as a switching element, is shown in FIG. 15. A MIM element 900 and a liquid crystal element 800 are connected in series between a signal line 600 and a scan line 700. The signal line 600 is driven by a signal line drive circuit 400 and the scan line 700 is driven by a scan line drive circuit 500. It should be noted that, although the MIM element 900 is connected to the scan line 700 and the liquid crystal element 800 is connected to the signal line 600 in FIG. 15, the configuration of this invention is not limited thereto and the MIM element 900 can equally well be connected to the signal line 600 with the liquid crystal element 800 connected to the scan line 700.

Figure 6:
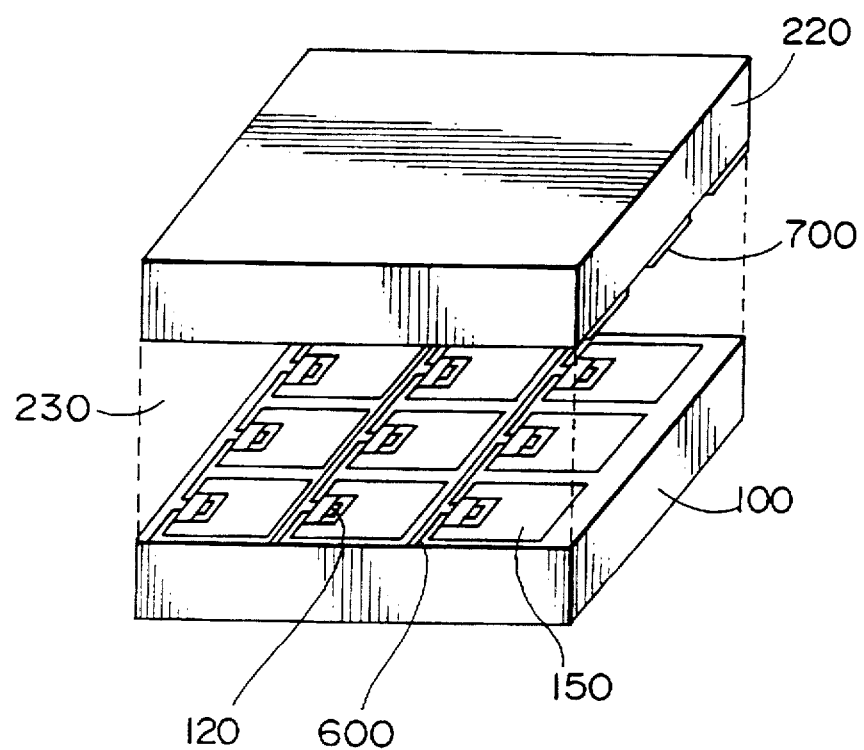
FIG. 6 shows the structure of an active matrix liquid crystal display device in which a MIM element is used as a switching element.

The structure of the liquid crystal display device of this invention is shown in FIG. 6. The structure is such that an active matrix substrate 100 on which is formed a pixel electrode 150 is disposed facing an opposite substrate 220 on which is formed a strip-like opposite electrode (scan line) 700, and a liquid crystal layer 230 is inserted therebetween.

In order to illustrate the MIM element of this invention and a fabrication method thereof in more detail, preferred embodiments and experimental examples will be described below.

EMBODIMENTS AND EXPERIMENTAL EXAMPLES

Figure 7A:
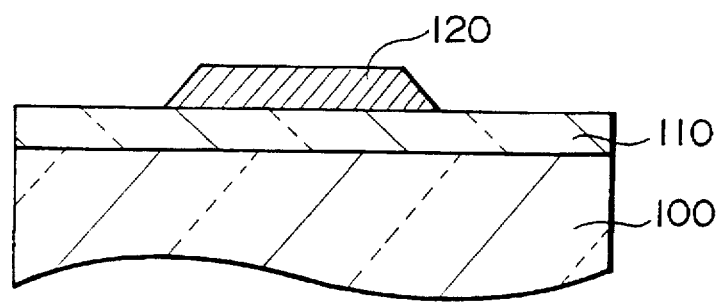
FIGS. 7A to 7C are cross-sectional views through a MIM device, illustrating steps in the process of fabricating a MIM element.
Figure 7B:
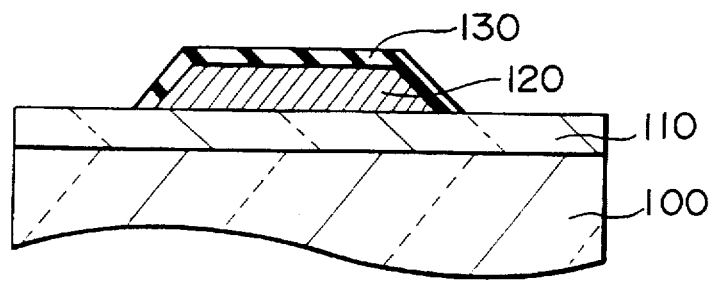
Figure 7C:
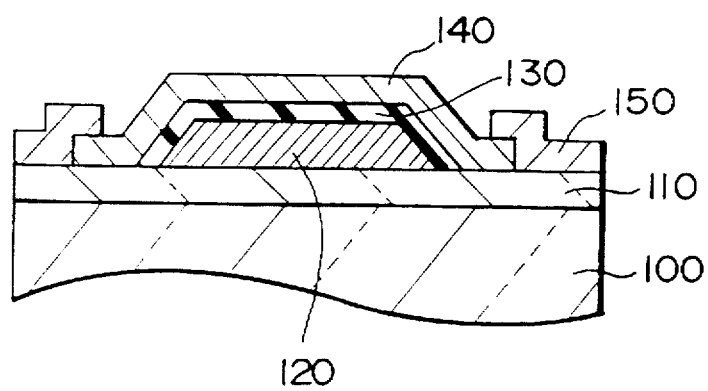

Samples of a plurality of MIM elements were formed by fabrication steps as shown in FIGS. 7A to 7C, with differing tungsten concentrations of the first conductive film and anodization conditions, and the characteristics thereof were investigated. Each MIM element was formed as described below.

A tantalum-tungsten alloy film (first conductive film) 120 was formed on a tantalum oxide ($Ta_2O_5$) film 110 provided on the surface of a glass substrate 100, and was shaped to a predetermined pattern (FIG. 7A).

The thickness of the tantalum-tungsten alloy film was 300 nm. This alloy film was formed by using a 99.99%-pure tantalum-tungsten mixture as a target and sputtering from it at a degree of vacuum on the order of 0.1 Pascal to 0.5 Pascal at a power of 3 kW. Note that a comparative example in which the film was of tantalum alone was also formed.

The first conductive film 120 was then anodized to form the insulating film 130 (FIG. 7B).

Figure 8A:
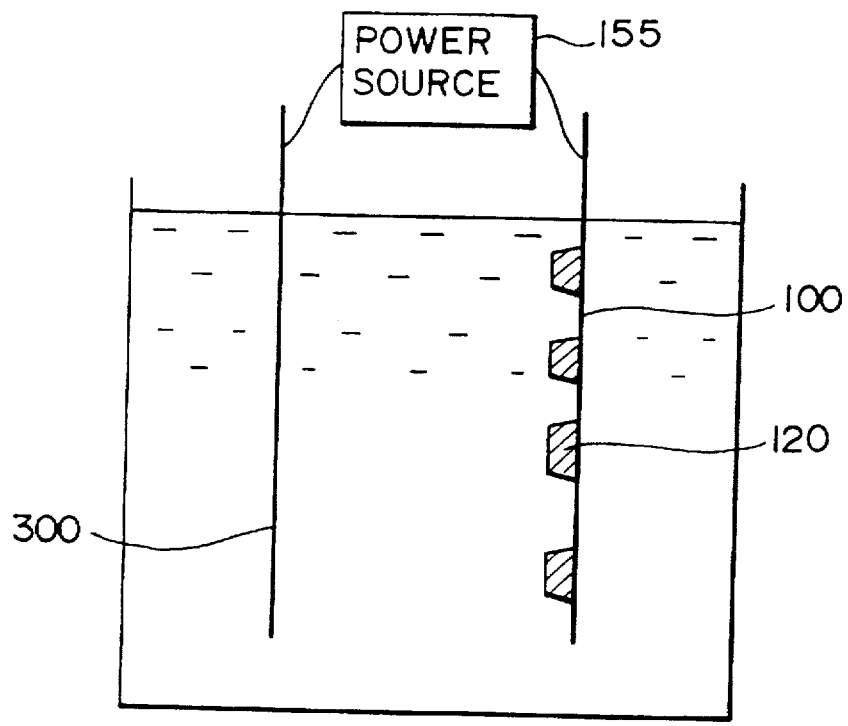
FIGS. 8A and 8B are views illustrative of the method of forming an insulating film by anodization.
Figure 8B:
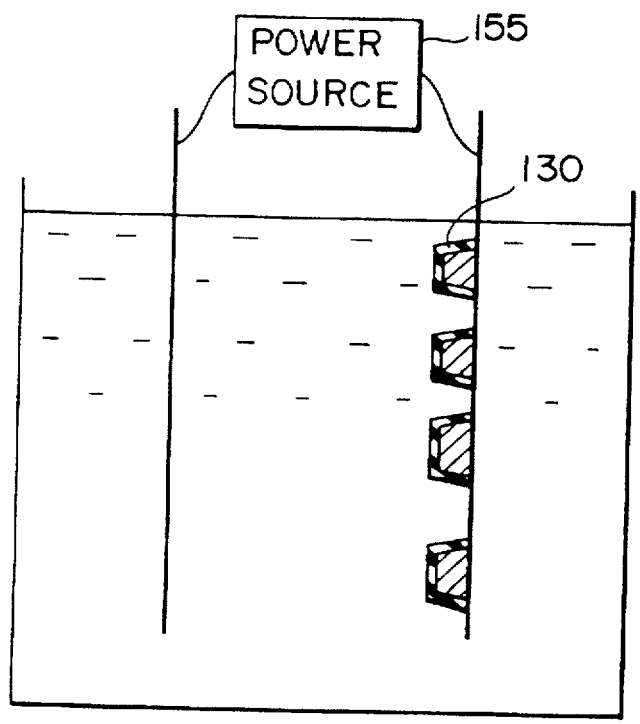

The anodization was performed by inserting the substrate 100 into an electrolyte as shown in FIG. 8A, using the substrate 100 as an anode, disposing a cathode 300 opposite to the substrate, raising the voltage applied thereto to 28 V using a constant current (0.1 mA/$cm^2$) process, then leaving the substrate in place while applying a constant voltage of 28 V for 2 hours. As a result, a 50-nm insulating film was formed on the tantalum-tungsten alloy film 120, as shown in FIG. 8B.

An aqueous solution of ammonium tungstate was used as the electrolyte. Note that an aqueous solution of citric acid was used for comparative examples.

Ammonia (ammonia water) was used as the pH conditioner.

The temperature of the electrolyte was controlled to be within the range of 0° C. to 10° C. Note that experiments were also performed on comparative examples in which the temperature of the electrolyte was maintained at room temperature.

After the anodization, the anodized film was annealed at various different temperatures.

A chrome film was then deposited by sputtering to form a second conductive film 140, then a 50-nm ITO electrode was formed thereon. Samples were also fabricated using an ITO film (50 nm) as the second conductive film 140.

The thus fabricated samples were analyzed, with the results as described below.

1. Effects of the Addition of Tungsten to the First Conductive Film 120

Figure 3:
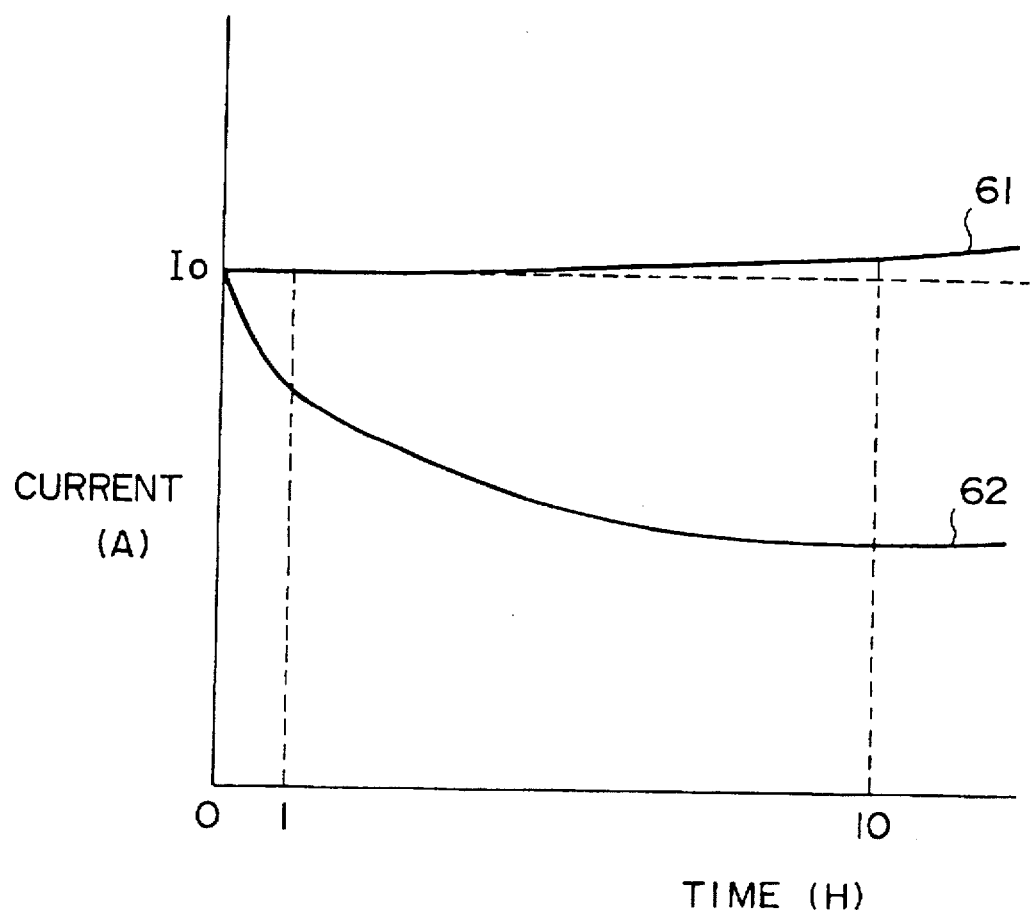
FIG. 3 shows a comparison between the time-dependent variation (characteristic line 61) in the on-current of the MIM element when a tantalum-tungsten alloy film is used as the first conductive film of the MIM element and time-dependent variation (characteristic line 62) in the on-current of the MIM element when a metal film of tantalum alone is used as the first conductive film.

(1) The graph of FIG. 3 shows that the time-dependent variation in the on-current value of a sample to which tungsten has been added (characteristic line 61) is far less than that of a sample with no added tungsten (characteristic line 62).

(2) Note, however, that if ammonium tungstate is used as the electrolyte for the anodization instead of citric acid, a difference was noted in the effect of controlling the time-dependent variation of the on-current value of the MIM element. In other words, when ammonium tungstate was used, the time-dependent variation in the on-current value of the MIM element was even less than in the case in which citric acid was used.

To investigate the reasons for this, secondary ion mass spectroscopy (SIMS) was used to analyze the distribution of the impurity concentrations in the film thickness direction within the insulating film, for a first sample that exhibited preferable characteristics and a second sample with characteristics inferior to those of the first sample. The samples were fabricated as described below.

FIRST SAMPLE

A film of tantalum comprising 0.2 wt. % of tungsten was used as the first conductive film. Ammonium tungstate was used as the electrolyte for the anodization, and the pH was conditioned with ammonia to give a pH of 9. Specific details of the concentration of the electrolyte used in the anodization were not particularly relevant, provided that the concentration enabled to condition the pH by adding ammonia. The temperature of the electrolyte was maintained at between 0° C. and 10° C. Annealing at 430° C. was performed after the anodization.

SECOND SAMPLE

A film of tantalum comprising 0.2 wt. % of tungsten was used as the first conductive film. Citric acid was used as the electrolyte for the anodization, and the pH was conditioned with ammonia to give a pH of 9. Specific details of the concentration of the electrolyte used in the anodization were not particularly relevant, provided that the concentration enabled to condition the pH by adding ammonia. The temperature of the electrolyte was maintained at between 0° C. and 10° C. Annealing at 430° C. was performed after the anodization.

Figure 1A:
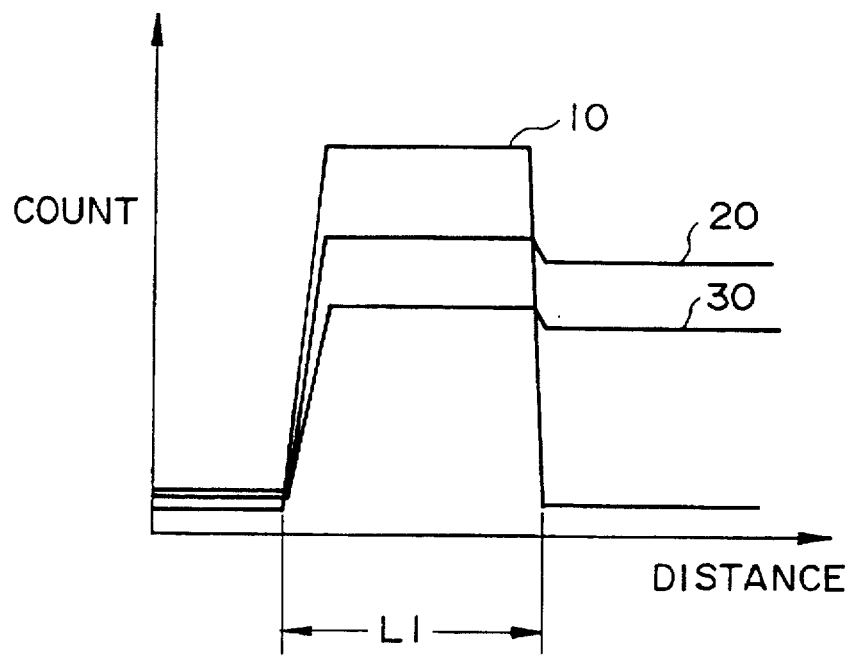
FIG. 1A shows an example of the results of analysis into the distribution of elements incorporated within an insulating film formed by anodization, using secondary ion mass spectroscopy (SIMS)

Results of analysis performed by SIMS on the first sample are shown in FIG. 1A, and similar analysis results for the second sample are shown in FIG. 18. The SIMS analysis was performed by using cesium ions ($Cs^+$) and oxygen ions ($O^{2-}$) to etch the MIM element and using a mass spectrometer to count the numbers of atoms sputtered thereby from a point A on the surface of the MIM element.

Figure 1B:
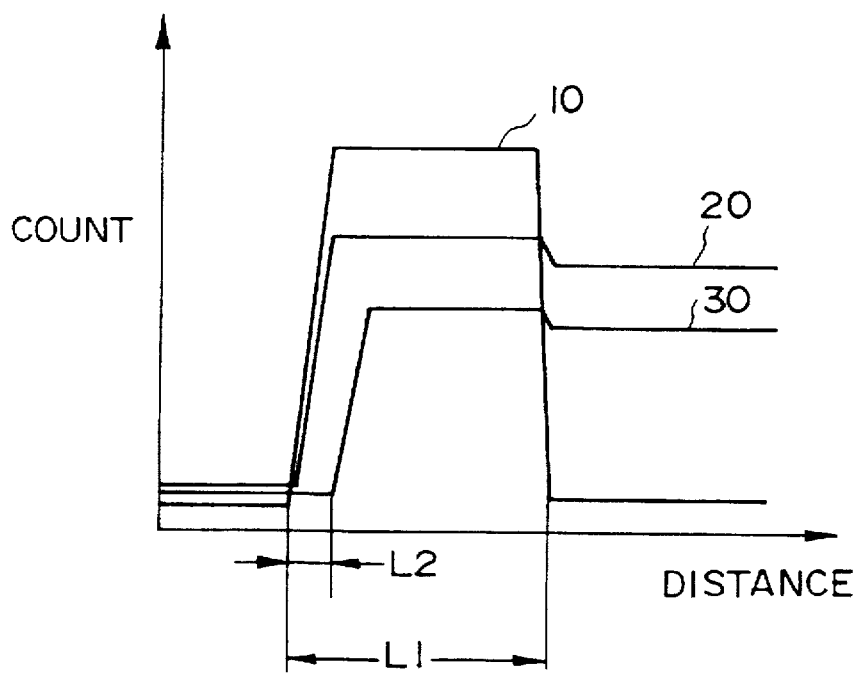
Fig. 1B shows another example (comparative example) of such analysis results.
Figure 17A:
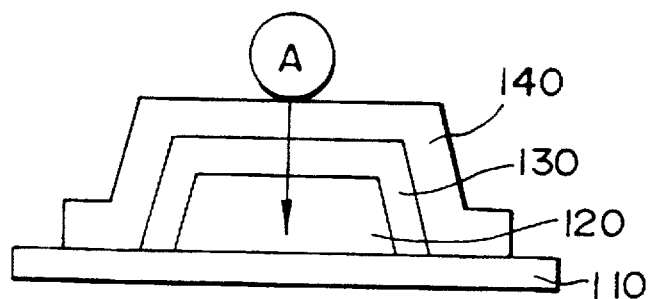
FIG. 17A is a view illustrative of the analysis method using SIMS and FIG. 17B is a graph of the relationship between the concentration of tungstic acid ions in the electrolyte and the depth of intrusion of tungsten in the film thickness direction of the insulating film.

The count obtained by SIMS is plotted along the vertical axis (in arbitrary units) in graphs shown in Figs. 1A and 1B, and distance from the point A of the surface shown in FIG. 17A is plotted along the horizontal axis.

In FIGS. 1A and 1B, a characteristic line 10 shows the distribution of oxygen atoms, a characteristic line 20 shows the distribution of tantalum atoms, and a characteristic line 30 shows the distribution of tungsten atoms, where L1 is the thickness of the insulating film (=50 nm) and L2 is the thickness of a layer in which there are no tungsten atoms.

The first sample, in which time-dependent variations in the current value are small, had an unbroken distribution of tungsten atoms through the insulating film 130, as shown in FIG. 1A. In contrast, the second sample, with inferior characteristics, had a layer within the insulating film 130 in which there were no tungsten atoms (equivalent to L2). This difference in structure is determined by whether or not there is a supply of tungsten atoms from the electrolyte.

That is to say, since the second sample was formed by anodization using citric acid containing no tungstic acid ions, the supply of tungsten into the insulating film occurred only from the first conductive film 120. This supply from the first conductive film 120 alone means that an insufficient quantity of tungsten is supplied for forming a continuous distribution through the insulating layer, and thus a layer L2 is formed in which there are no tungsten atoms, as shown in FIG. 1B.

With the first sample, on the other hand, tungsten is supplied to the insulating film from the ammonium tungstate which is the electrolyte, so that there is a substantially uniformly continuous distribution of tungsten within the insulating film, as shown in FIG. 1A.

Figure 17B:
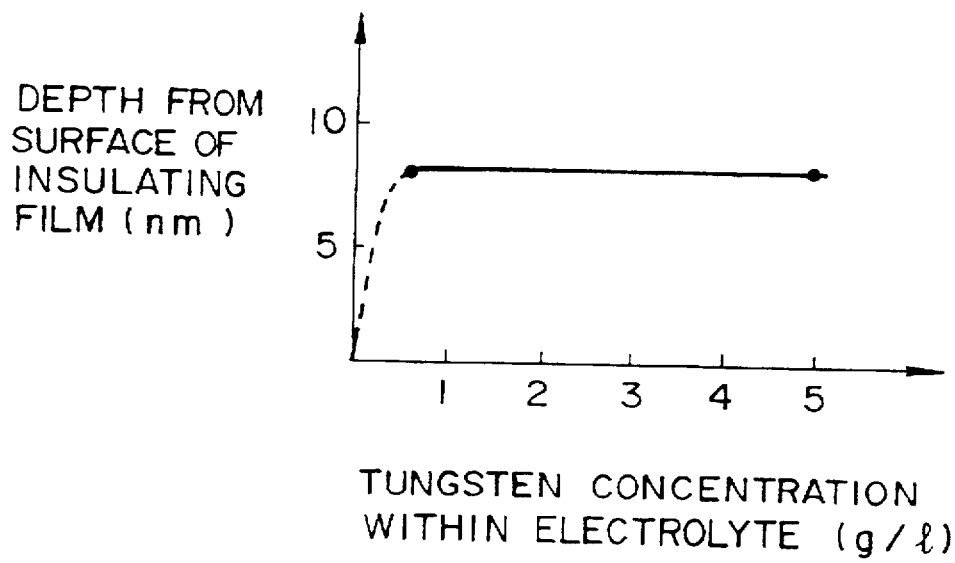

The relationship between the concentration of tungstic acid ions in the electrolyte and the depth of intrusion of tungsten in the film thickness direction of the insulating film was investigated, with the results as shown in FIG. 17B. It is clear from FIG. 17B that the depth of intrusion of tungsten within the insulating film is substantially constant, except when the concentration of tungstic acid ions in the electrolyte is extremely small.

In other words, the concentration of tungsten within the insulating film is substantially continuous and substantially uniform in the film thickness direction of the insulating film, as shown in FIG. 1A, so that there is no concentration gradient, provided that anodization is performed at a concentration capable of allowing pH conditioning by ammonia.

It has been clarified that variations in the on-current of the MIM element can be greatly reduced by ensuring that the distribution of tungsten within the insulating film is continuous and uniform in this way.

Figure 2A:
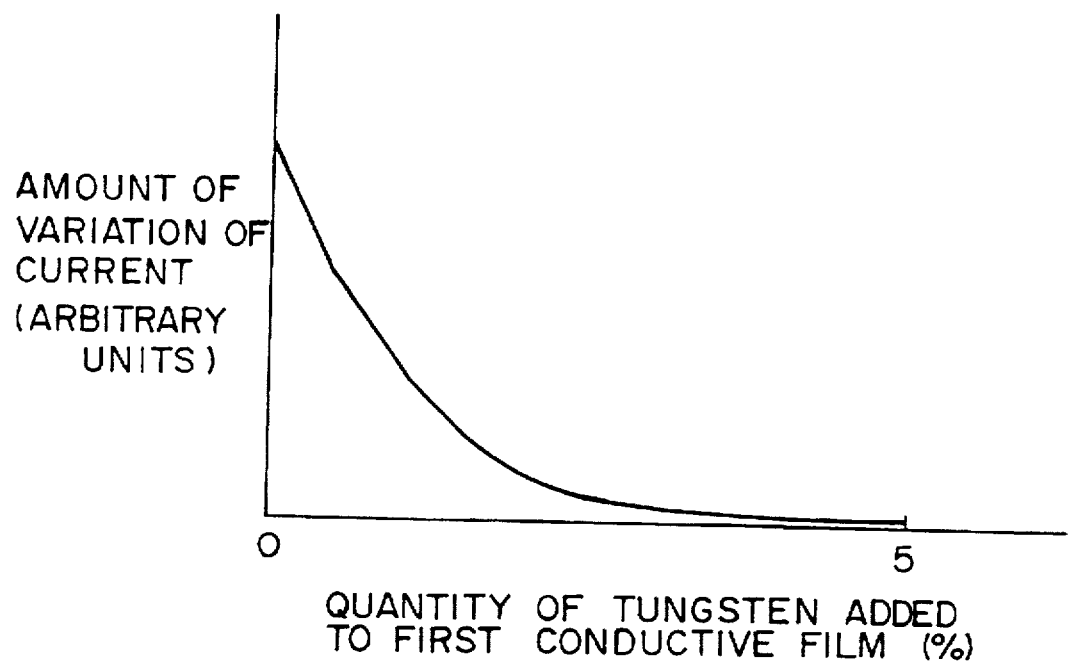
FIG. 2A shows the relationship between the quantity of tungsten added to the first conductive film of the MIM element and the amount of variation in the on-current of the MIM element before and after the MIM element is driven for 10 hours continuously.

Note that the supply of tungsten to the insulating film improves as the quantity of tungsten incorporated within the first conductive film 120 increases, and time-dependent variations in the on-current value of the MIM element decrease as the quantity of tungsten incorporated within the first conductive film 120 increases, as shown in FIG. 2A. Furthermore, the thickness L2 of the region in which there are no tungsten atoms decreases as the quantity of tungsten incorporated within the first conductive film 120 increases, as shown in FIG. 2B.

However, it should be noted that, if the quantity of tungsten incorporated within the first conductive film 120 is small, the supply of tungsten from the first conductive film 120 alone makes it effectively difficult to reduce the thickness L2 of the region in which there are no tungsten atoms to zero. Therefore it is important to supply tungsten from the electrolyte.

Figure 2B:
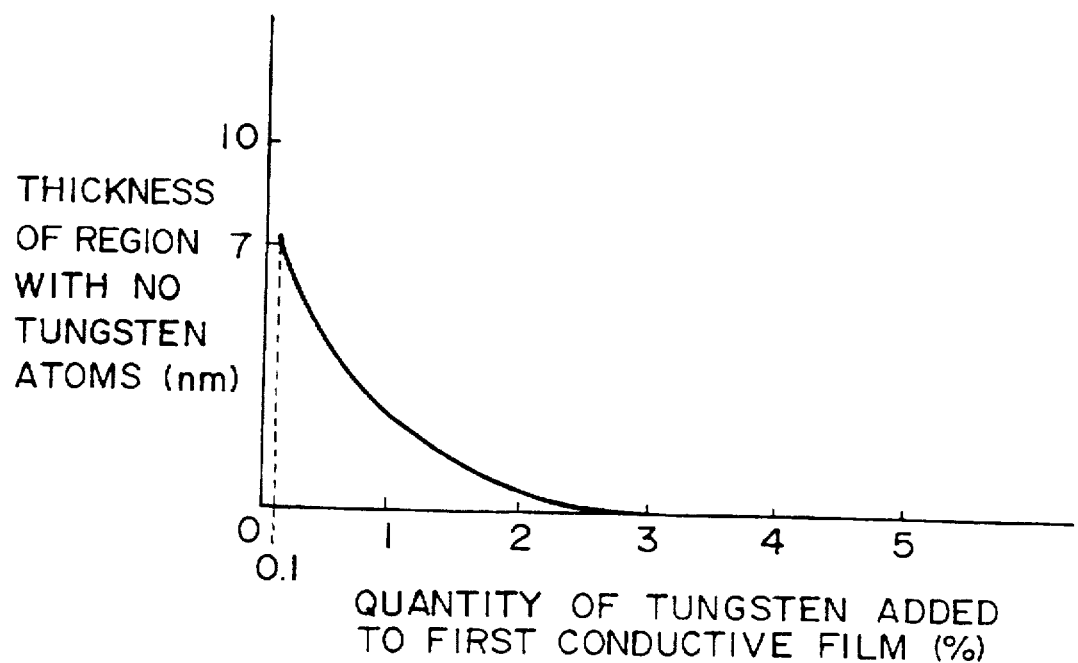
FIG. 2B shows the relationship between the quantity of tungsten added to the first conductive film of the MIM element and the thickness of a region within the insulating film where there is no tungsten.

In other words, if the tungsten concentration in the first conductive film is 0.1 wt. % and citric acid is used as the electrolyte in the example shown in FIG. 2B, the thickness L2 of the region in which there are no tungsten atoms is on the order of 7 nm.

The results discussed below were obtained from investigation of the supply of tungsten from the electrolyte alone, using a sample in which there was no tungsten added to the first conductive film and an aqueous solution of ammonium tungstate was used as the electrolyte for the anodization, where the distribution of tungsten through the insulating film was analyzed by SIMS. In this case, it was determined that a sufficient quantity of tungsten was introduced into the insulating film in the region corresponding to the above described region of thickness L2 in which there were no tungsten atoms, by the supply of tungsten from the aqueous solution of ammonium tungstate.

From consideration of the above, it was determined that a continuous and substantially uniform distribution of tungsten in the thickness direction of the insulating film can be obtained within the insulating film by setting the tungsten concentration in the first conductive film to at least 0.1 wt. % and using an aqueous solution of ammonium tungstate as the electrolyte, so that tungsten is introduced into the insulating film from both the first conductive film and the electrolyte.

(3) The present inventors also investigated suitable values for the tungsten concentration within the first conductive film when a metal film or an ITO film was used as the second conductive film.

Results of further analysis by the present inventors has determined that, when a metal (chrome) is used for the second metal film, a continuous and uniform distribution such as that shown in FIG. 1A can be implemented by setting the ratio by weight of tungsten atoms incorporated within the first conductive film to 0.1 wt. % to 2.0 wt. % and using a solution comprising an ammonium tungstate as the electrolyte for the anodization.

When an ITO film is used as the second conductive film, it has been determined that the region in which there are no tungsten atoms disappears and a reduced resistance of the insulating film can be obtained by doping with tungsten atoms, if the ratio by weight of tungsten atoms incorporated within the first conductive film is 1.0 wt. % to 10.0 wt. % and anodization of the insulating film 130 is performed by using a solution comprising an ammonium tungstate.

In other words, when an ITO film is used, oxygen atoms from that ITO film migrate into the insulating film, increasing the resistance of the insulating film and making it difficult for the on-current to flow. It is therefore necessary to increase the supply of tungsten atoms from the first conductive film to alleviate this increase in resistance, and thus the tungsten concentration of the first conductive film must be made higher than that used in a configuration in which a film of a metal such as chrome is used as the second conductive film.

2. Optimal Temperature of Electrolytic Solution during Anodization

The optimal temperature of the electrolyte used for the anodization was investigated. As a result, it became clear that a MIM element with a steep voltage-current characteristic and a small "polarity difference" can be obtained when anodization is implemented for a first conductive film 120 comprising tantalum and tungsten, provided that the temperature of the electrolyte is maintained at between 0° C. and 10° C. (preferably between 1° C. and 5° C.)

Figure 9:
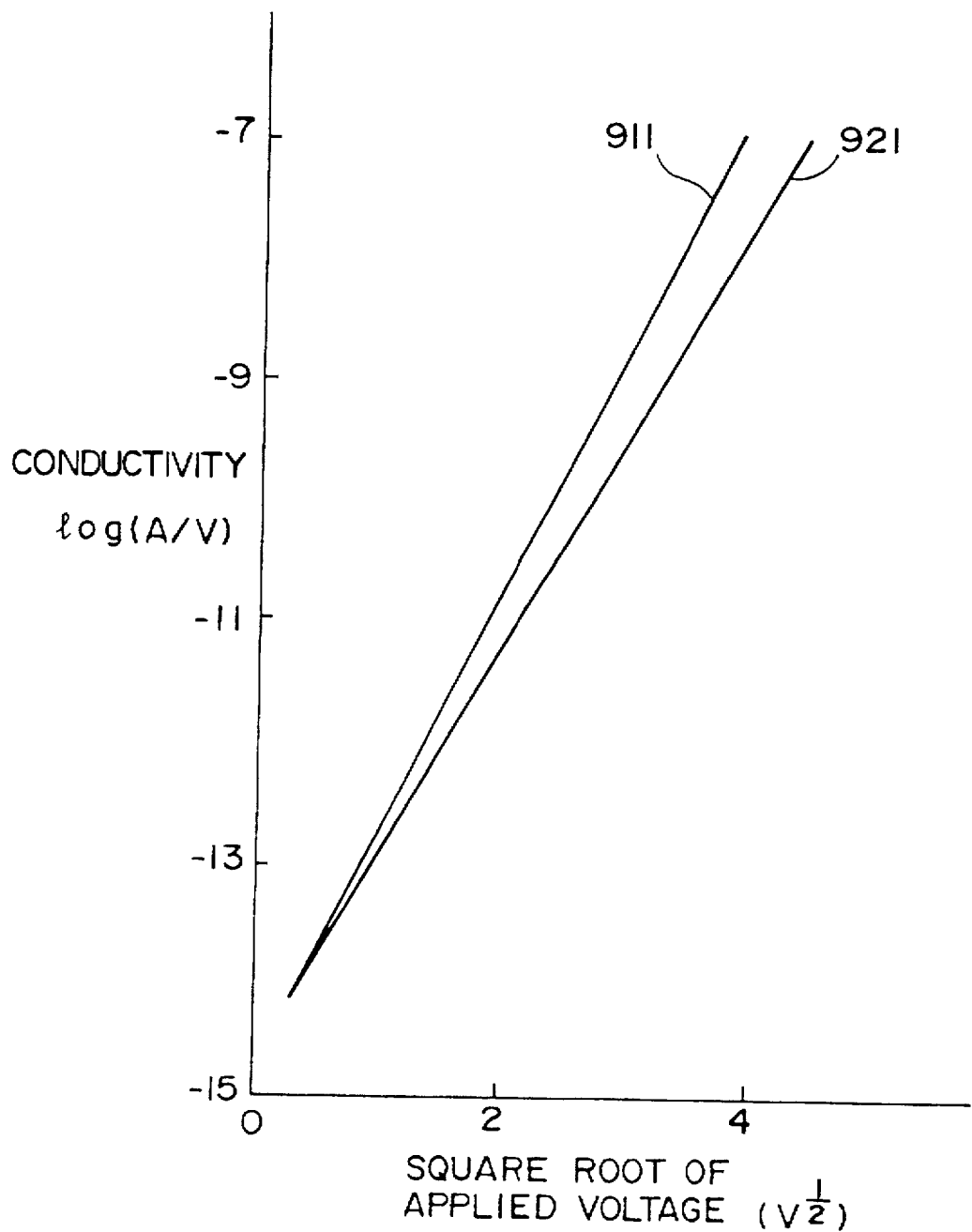
FIG. 9 is a graph illustrative of the difference in steepness of the current-voltage characteristics of MIM elements when anodization is performed with the temperature of the electrolyte maintained at a low temperature (0° C. to 10° C.) and when it is performed at room temperature (25° C.)

The results of investigations into the voltage-current characteristics (variation of electrical conductivity with respect to applied voltage) for different samples of MIM elements are shown in FIG. 9.

A characteristic line 911 is that for a tantalum film (first conductive film) to which is added 0.7 wt. % of tungsten, when anodization was performed with the temperature of an aqueous solution of ammonium tungstate maintained at 3° C.±0.21° C.

A characteristic line 921 is that for a tantalum film (first conductive film) to which is added 0.7 wt. % of tungsten, when anodization was performed with the temperature of an aqueous solution of ammonium tungstate maintained at room temperature.

The characteristic line 911, which is that of the sample wherein the temperature of the electrolyte was maintained at 3° C., exhibits a large steepness ($\beta$ value) in the current-voltage characteristic. In contrast, the characteristic line 912, which is that of the sample wherein the temperature of the electrolyte was maintained at room temperature, has a lower steepness in the current-voltage characteristic. Therefore, if the capacity of the MIM element is the same, a MIM element using an insulating film obtained by anodization at an electrolyte temperature of 3° C. has a current-voltage characteristic with a steepness that is of the order of 15% steeper than that of a MIM element using an insulating film obtained by anodization with the electrolyte at room temperature.

Figure 10:
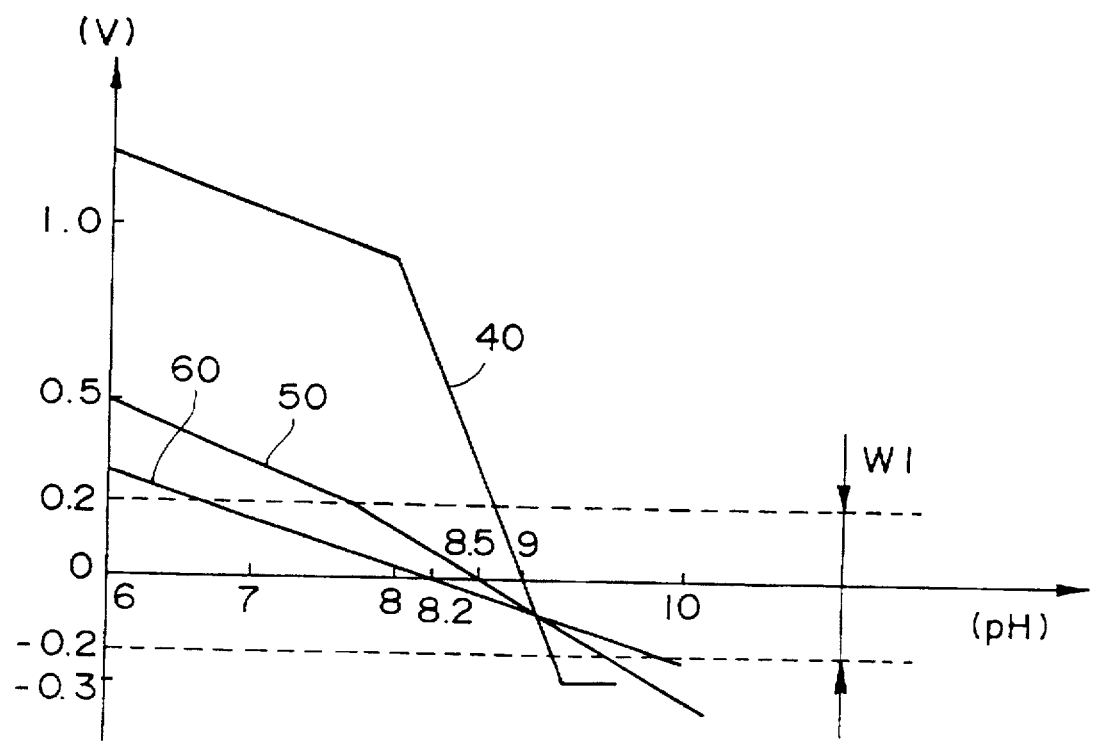
FIG. 10 is a graph of the relationship between the quantity of tungsten incorporated within the first conductive film plus the pH of the electrolyte and the "polarity difference" of the MIM element.

3. Relationship between "Polarity Difference" and the Quantity of Tungsten Incorporated within the First Conductive Film Together with the pH of the Electrolytic Solution Results obtained by investigating the relationship between the quantity of tungsten incorporated within the first conductive film plus the pH of the electrolyte and the "polarity difference" are shown in FIG. 10. The samples used to achieve these results were annealed at 380° C. after the anodized film was formed over the first conductive film. In FIG. 10, pH is plotted along the horizontal axis and polarity difference along the vertical axis.

A characteristic line 40 in FIG. 10 is that obtained when 0.2 wt. % of tungsten was added to the first conductive film, a characteristic line 50 is that obtained when 0.7 wt. % of tungsten was added to the first conductive film, and a characteristic line 60 is that obtained when 1.0 wt. % of tungsten was added to the first conductive film. As is clear from these characteristics, the effect of pH on the "polarity difference" varies with the quantity of tungsten within the first conductive film. Note that W1 in FIG. 10 is the permissible range of "polarity difference" for a MIM element.

Figure 11:
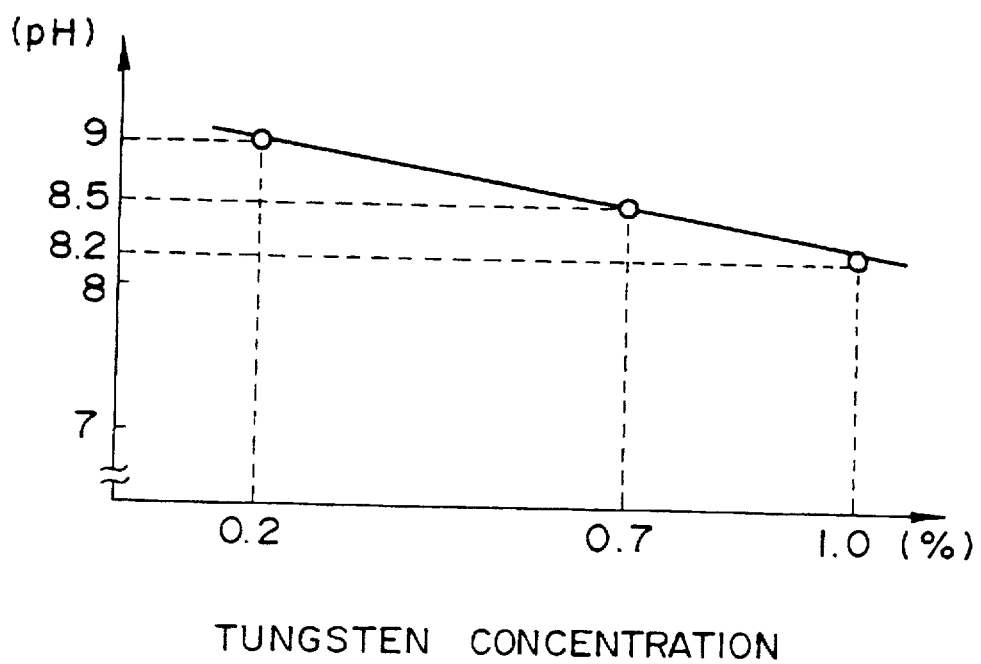
FIG. 11 is a graph of the relationship between the quantity of tungsten incorporated within the first conductive film and the pH necessary for making the "polarity difference" of the MIM element zero.

As is clear from FIG. 10, when 0.2 wt. % of tungsten is added to the first conductive film, the pH at which the "polarity difference" is zero is 9.0. Furthermore, when 0.7 wt. % of tungsten is added to the first conductive film, the pH at which the "polarity difference" is zero is 8.5. When 1.0 wt. % of tungsten is added to the first conductive film, the pH at which the "polarity difference" is zero is 8.2. A graph of the relationship between the quantity of tungsten incorporated within the first conductive film and the pH at which the "polarity difference" is zero is shown in FIG. 11. This graph shows that the pH at which the polarity difference is zero drops with increasing tungsten concentration.

Thus it is possible to obtain a zero "polarity difference" by using an electrolyte comprising tungstic acid ions, such as an aqueous solution of ammonium tungstate, for the anodization and controlling the pH with an ammonia in accordance with the quantity of tungsten incorporated within the first conductive film.

If potassium hydroxide was used as the pH conditioner instead, it was found that the "polarity difference" of the MIM element is far more dependent on the pH than when ammonia was used. It is therefore preferable to use ammonia as the pH conditioner. In other words, use of ammonia as the pH conditioner facilitates control of the pH to make the "polarity difference" zero.

It should be noted, however, that the quantity of tungsten incorporated within the first conductive film could be reduced if it is considered important to not only make the "polarity difference" zero but also obtain a preferable voltage-current characteristic for the MIM element.

Figure 12:
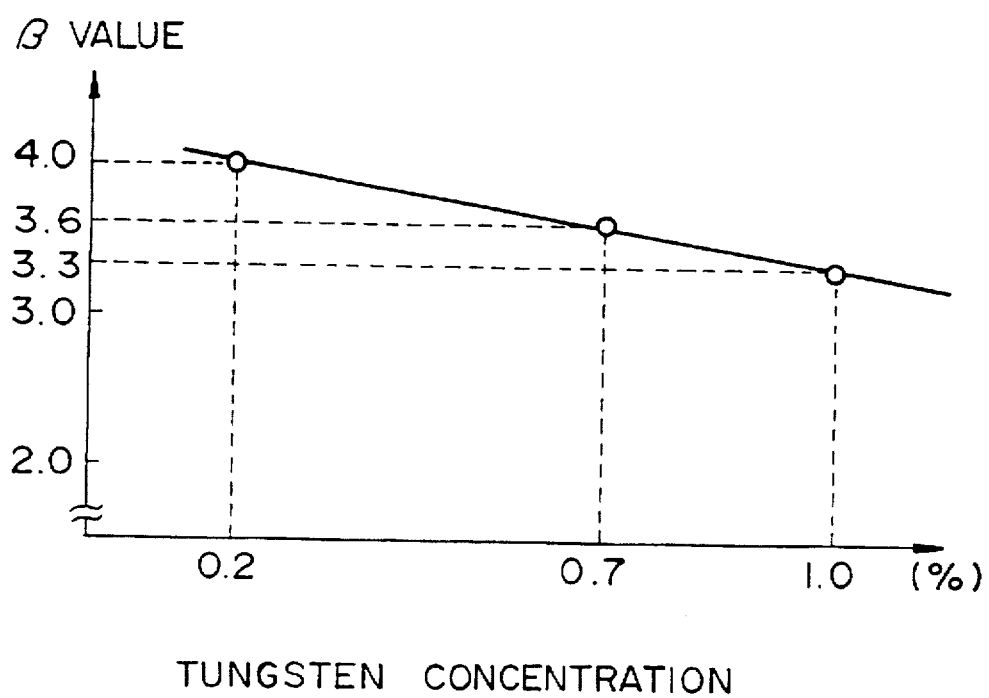
FIG. 12 is a graph of the relationship between the quantity of tungsten incorporated within the first conductive film and the steepness (β value) in the current-voltage characteristics of the MIM element.
Figure 13:
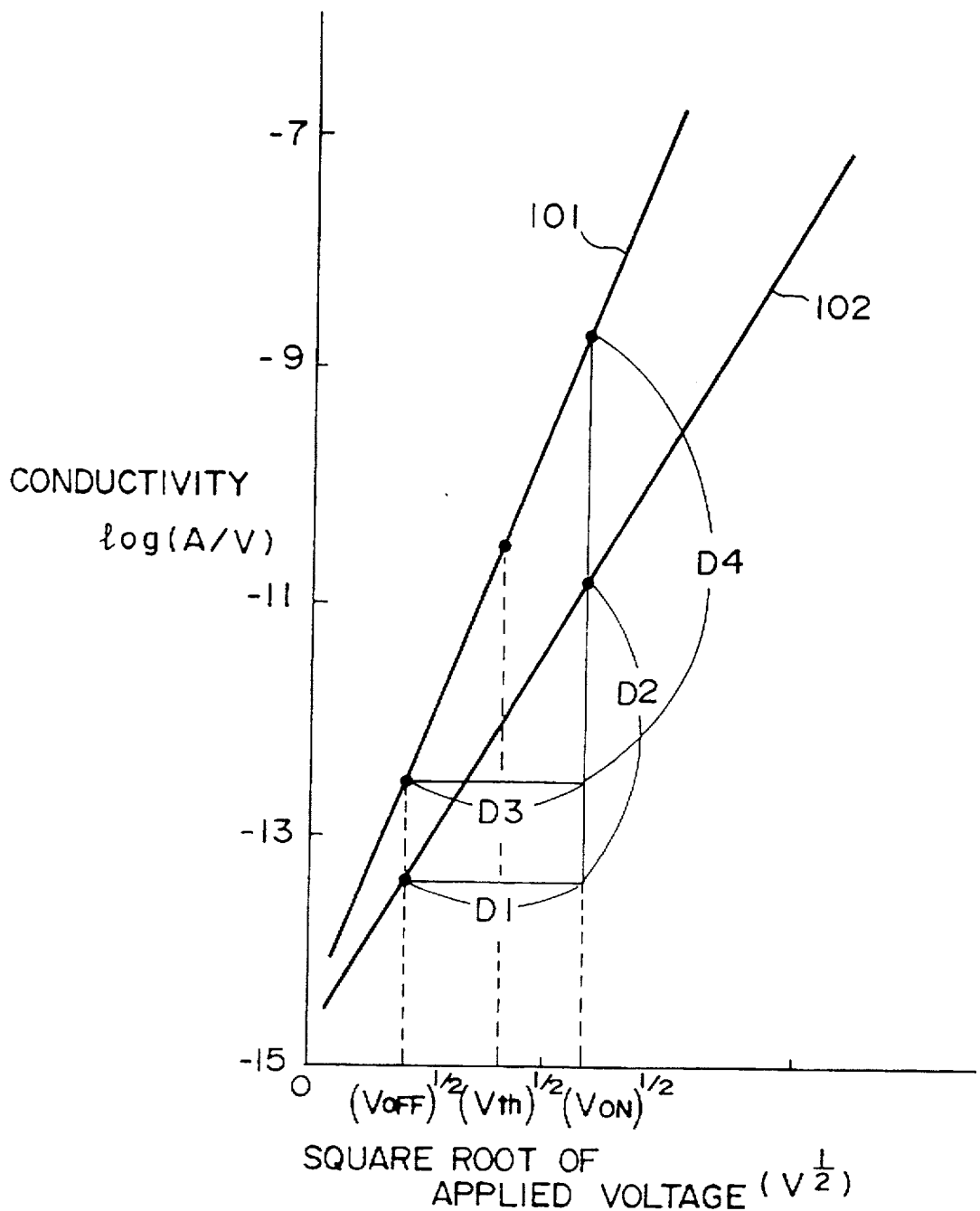
FIG. 13 is a graph illustrative of the steepness (β value) in the current-voltage characteristics of the MIM element.

In other words, FIG. 12 shows that the MIM element exhibits a high "β value" when the tungsten concentration is low. This "β value" is a quantity expressed as the ratio of the voltage difference (D1 or D3) between the on voltage ($V_{ON}$) and the off voltage ($V_{OFF}$) of the MIM element to the amount of variation (D2 or D4) in the electrical conductivity (logarithmic values) of the MIM element at those voltages, in other words, the rate of change of electrical conductivity, as shown in FIG. 13 where a characteristic line 101 has a higher "β value" than a characteristic line 102.

Therefore, from samples in which 1.0 wt. %, 0.7 wt. %, and 0.2 wt. % of tungsten was added to the first conductive film, it is preferable to use the sample in which 0.2 wt. % was added, to obtain a high "β value." In this case, the pH of the electrolyte could be controlled to 9.0 to set the "polarity difference" to zero.

4. Relationship between Post-Anodization Annealing Temperature and "Polarity Difference"

The present applicants varied the annealing temperature after the anodization to investigate the relationship between pH and "polarity difference" of the MIM element during the anodization, using samples in which the quantity of tungsten added to the first conductive film was 0.2 wt. %.

Figure 14:
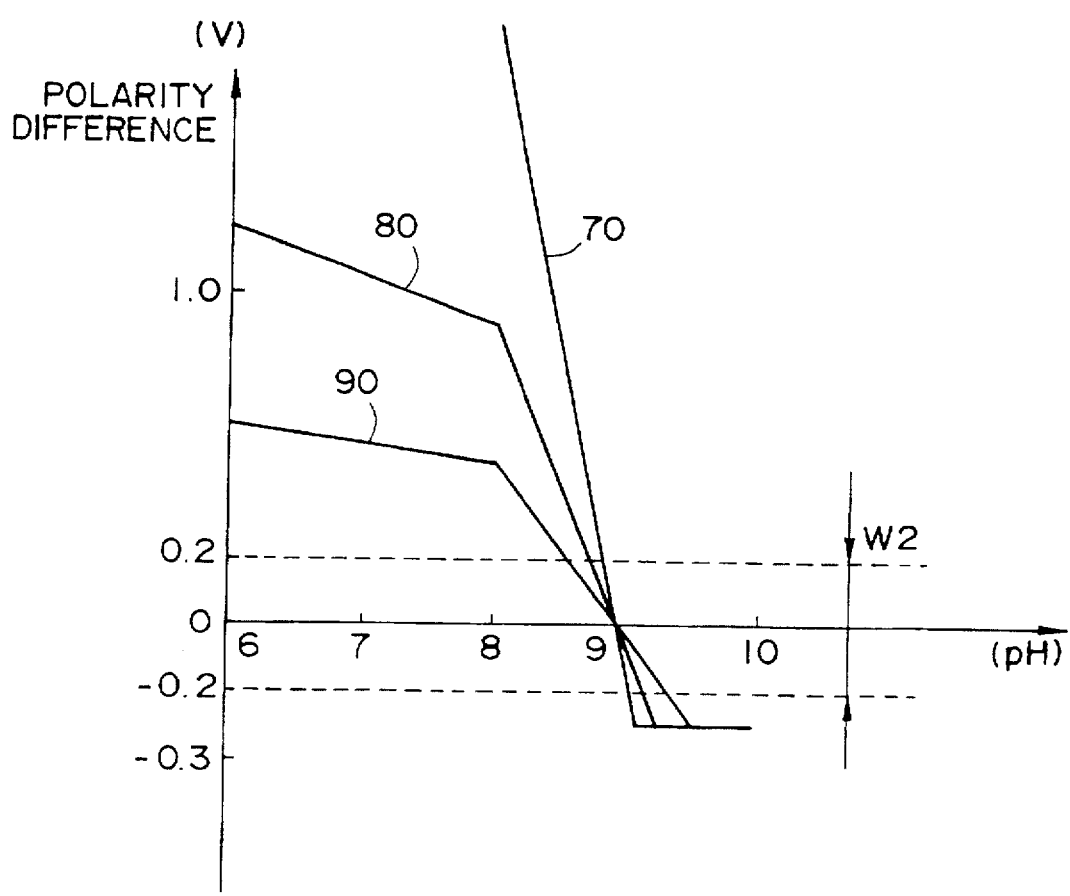
FIG. 14 is a graph of the relationship between post-anodization annealing temperature and "polarity difference" of the MIM element.

A characteristic line 70 in FIG. 14 shows the characteristic obtained when the annealing temperature was 350° C., a characteristic line 80 shows that obtained when the annealing temperature was 380° C., and a characteristic line 90 shows that obtained when the annealing temperature was 430° C. W2 in FIG. 14 is the permissible range (±0.2) of "polarity difference" for a MIM element.

As is clear from FIG. 14, the polarity difference of each of these characteristic lines crosses zero at the previously described pH of 9.0, but apart from this common point, there are huge differences in "polarity difference" at other values of pH.

In other words, the characteristic line 70 for the case in which the annealing temperature was 350° C. has a large rate of variation in polarity difference with respect to change in pH, making control difficult. It is therefore difficult to control the characteristics of the MIM element accurately at an annealing temperature of less than 350° C.

The "polarity difference" for values of pH other that 9.0 with the characteristic line 90 for the case in which the annealing temperature was 430° C. is approximately half the "polarity difference" of the characteristic line 80 for the case in which the annealing temperature was 380° C. Therefore, an annealing temperature of 430° C. makes it easier to control the element characteristics. Note that annealing temperatures of greater than 450° C. cause deterioration in the reliability of the substrate itself. Therefore it is preferable to use an annealing temperature of between 350° C. and 450° C., and an annealing temperature of 430° C. is more preferable for facilitating control over the element characteristics.

When "polarity difference" was measured using the above described first sample, the "polarity difference" was zero. However, when "polarity difference" was measured using the above described second sample, the "polarity difference" was 0.4 V and this value was substantially constant, regardless of changes in the pH of the electrolyte.

As described above, in order to obtain a MIM element exhibiting preferred characteristics, it is preferable to form the insulating film on the first conductive film by anodization of the first conductive film, using an electrolyte comprising tungstic acid ions and under conditions by which the pH of the electrolyte is conditioned in accordance with the tungsten concentration within the first conductive film. It is also preferable that an aqueous solution of ammonium tungstate is used as the electrolyte for the anodization and ammonia is used as the pH conditioner. It is further preferable that the electrolyte is maintained at between 0° C. and 10° C., and it is still further preferable that the annealing after the anodization is performed at a predetermined temperature.

The above described fabrication method enables the fabrication of a MIM element in which tantalum atoms and tungsten atoms are distributed continuously within the insulating film in the film thickness direction of the insulating film. This MIM element has a small "polarity difference" and the ratio of the on-current to the off-current of the MIM element is greater than in the prior art.

When this MIM element is used as a switching element in the fabrication of a liquid crystal display device such as that shown in FIG. 6 or FIG. 15, a highly reliable liquid crystal display device capable of a high-quality display is provided. When used as the display device of electronic equipment such as a personal computer, the liquid crystal display device of this invention enables a further increase in the value of the resultant product.

What is claimed is:

1. A nonlinear resistance element comprising a first conductive film, an insulating film, and a second conductive film deposited in sequence on a substrate; wherein:
   tungsten atoms are distributed continuously within said insulating film in the film thickness direction of said insulating film.

2. The nonlinear resistance element as defined in claim 1, wherein:
   tungsten atoms have a substantially uniformly distribution in the film thickness direction of said insulating film, within said insulating film.

3. The nonlinear resistance element as defined in claim 1, wherein:
   said first conductive film is a metal film having tantalum as a main component to which is added-tungsten;
   said insulating film is an anodized film of said first conductive film and tantalum atoms and tungsten atoms are distributed continuously within said insulating film in the film thickness direction of said insulating film; and
   said second conductive film is formed of a metal.

4. The nonlinear resistance element as defined in claim 3, wherein:
   tungsten is added to said first conductive film in a proportion of between 0.1 wt. % to 2.0 wt.%.

5. The nonlinear resistance element as defined in claim 1, wherein:
   said first conductive film is a metal film having tantalum as a main component to which is added tungsten;
   said insulating film is an anodized film of said first conductive film and tantalum atoms and tungsten atoms are distributed continuously within said insulating film in the film thickness direction of said insulating film; and
   said second conductive film is a transparent conductive film formed of indium tin oxide (ITO).

6. The nonlinear resistance element as defined in claim 5, wherein:
   tungsten is added to said first conductive film in a proportion of between 1.0 wt. % to 10.0 wt. %.

7. A liquid crystal display device comprising:
   a first electrode substrate having a transparent substrate, one of a scan line and a signal line arranged in a predetermined pattern on said substrate, a nonlinear resistance element as defined in claim 1 connected to one of said scan line and said signal line at one side, and a pixel electrode electrically connected to the other side of said nonlinear resistance element;
   a second electrode substrate provided with one of a signal line and a scan line; and
   a liquid crystal layer interposed between said first electrode substrate and said second electrode substrate.

8. A method of fabricating a nonlinear resistance element of a configuration in which a first conductive film, an insulating film, and a second conductive film are deposited in sequence, wherein said method of fabricating a nonlinear resistance element comprises the steps of:
   forming on a substrate a first conductive film having tantalum as a main component to which is added tungsten;
   forming an insulating film on said first conductive film by anodization of said first conductive film, using an electrolyte comprising tungstic acid ions and under conditions by which the pH of said electrolyte is conditioned in accordance with the tungsten concentration within said first conductive film, such that tungsten atoms are distributed continuously within said insulating film in the film thickness direction of said insulating film; and
   forming a second conductive film on said insulating film.

9. The method of fabricating a nonlinear resistance element as defined in claim 8, wherein:
   an aqueous solution of ammonium tungstate is used as said electrolyte for said anodization, and ammonia is used as a pH conditioner to condition the pH of said electrolyte.

10. The method of fabricating a nonlinear resistance element as defined in claim 8, wherein:
    said electrolyte is maintained at between 0° C. and 10° C.

11. The method of fabricating a nonlinear resistance element as defined in claim 8, wherein:
    when said nonlinear resistance element is to be driven in such a manner that the polarity of a drive voltage is periodically inverted, the relationship is previously investigated between the tungsten concentration within said first conductive film and the pH of said electrolyte that enables a minimum in the amount of discrepancy in the voltage-current characteristics between the positive voltage side and the negative voltage side thereof; and
    the optimal pH of said electrolyte corresponding to said tungsten concentration within said first conductive film is determined from this relationship, and anodization is performed with said pH of said electrolyte being conditioned to said optimal pH.

12. The method of fabricating a nonlinear resistance element as defined in claim 11, wherein:
    anodization of said first conductive film is performed by causing the pH of the electrolyte to decrease in accordance with an increase in the tungsten concentration within a first conductive film.

13. The method of fabricating a nonlinear resistance element as defined in claim 8, wherein:
    annealing is performed after said anodization of said first conductive film.

14. The method of fabricating a nonlinear resistance element as defined in claim 13, wherein:
    the annealing temperature is within the range of 350° C. to 450° C.

15. The method of fabricating a nonlinear resistance element as defined in claim 8, wherein:
    tungsten is added to said first conductive film in a proportion of between 0.1 wt. % to 2.0 wt. % and said second conductive film is formed of a metal.

16. The method of fabricating a nonlinear resistance element as defined in claim 8, wherein:
    tungsten is added to said first conductive film in a proportion of between 1.0 wt. % to 10.0 wt. % and said second conductive film is a transparent conductive film formed of indium tin oxide (ITO).

17. The nonlinear resistance element configured of a first conductive film, an insulating film, and a second conductive film formed by deposition on a substrate by the fabrication method as defined in any one of claim 8.

18. A liquid crystal display device comprising:
a first electrode substrate having a transparent substrate, one of a scan line and a signal line arranged in a predetermined pattern on said substrate, a nonlinear resistance element as defined in either claim 17 connected to one of said scan line and said signal line at one side, and a pixel electrode electrically connected to the other side of said nonlinear resistance element;
a second electrode substrate provided with one of a signal line and a scan line; and
a liquid crystal layer interposed between said first electrode substrate and said second electrode substrate.

19. The method of fabricating a nonlinear resistance element as defined in claim 8, wherein:
in said step of forming on a substrate a first conductive film said tungsten is added in an amount of about 0.2 wt. %; and
said anodization is performed using an aqueous solution of ammonium tungstate as an electrolyte and using ammonia as a pH conditioner to condition the pH of said electrolyte to 9.0, and subsequently performing thermal processing at 430° C.

20. A nonlinear resistance element comprising a first conductive film, an insulating film, and a second conductive film deposited in sequence on a substrate, wherein tungsten atoms are distributed continuously within said insulating film in a film thickness direction of said insulating film and wherein distribution of said tungsten atoms is sufficient to yield a polarity difference in a range of ±0.2 volts.

21. The nonlinear resistance element of claim 20, wherein said tungsten atoms have a substantially uniform distribution within said insulating film in said film thickness direction of said insulating film.

22. The nonlinear resistance element of claim 20, wherein said first conductive film is a metal film having tantalum as a main component to which is added tungsten, wherein said insulating film is an anodized film of said first conductive film and wherein said tantalum atoms and said tungsten atoms are distributed continuously within said insulating film in said film thickness direction of said insulating film, and wherein said second conductive film is formed of a metal.

23. The nonlinear resistance element of claim 22, wherein said tungsten is present in said first conductive film in an amount of between 0.1 wt. % to 2.0 wt. % based on a total wt. % of said insulating layer.

24. The nonlinear resistance element of claim 20, wherein said first conductive film is a metal having tantalum atoms as a main component to which is added tungsten, wherein said insulating film is an anodized film of said first conductive film and said tantalum atoms and said tungsten atoms are distributed continuously within said insulating film in said film thickness direction of said insulating film, and wherein said second conductive film is a transparent conductive film formed of indium tin oxide.

25. The nonlinear resistance element of claim 24, wherein said tungsten is present in said first conductive film in an amount of 1.0 wt. % to 10.0 wt. % based on a total wt. % of said insulating layer.

26. A liquid crystal display device comprising:
a first substrate, one of a scan line and a signal line arranged in a predetermined pattern on said first substrate, a nonlinear resistance element of claim 20 connected to one of said scan line and said signal line at one side of said nonlinear resistance element, and a pixel electrode electrically connected to the other side of said nonlinear resistance element;
a second substrate provided with one of a signal line and a scan line; and
a liquid crystal layer interposed between said first substrate and said second substrate.

* * * * *